(12) United States Patent
Liu et al.

(10) Patent No.: US 8,212,281 B2
(45) Date of Patent: Jul. 3, 2012

(54) 3-D AND 3-D SCHOTTKY DIODE FOR CROSS-POINT, VARIABLE-RESISTANCE MATERIAL MEMORIES, PROCESSES OF FORMING SAME, AND METHODS OF USING SAME

(75) Inventors: Jun Liu, Boise, ID (US); Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 459 days.

(21) Appl. No.: 12/014,939

(22) Filed: Jan. 16, 2008

(65) Prior Publication Data

US 2009/0179187 A1 Jul. 16, 2009

(51) Int. Cl.
*H01L 21/20* (2006.01)
(52) U.S. Cl. ........ 257/104; 257/105; 257/106; 257/480; 257/481; 257/482; 438/92
(58) Field of Classification Search .................. 257/314, 257/480

See application file for complete search history.

(56) References Cited

U.S. PATENT DOCUMENTS

| | | | | |
|---|---|---|---|---|
| 4,160,259 | A * | 7/1979 | Nishizawa .................... | 257/264 |
| 6,404,033 | B1 | 6/2002 | Chang et al. | |
| 6,961,258 | B2 | 11/2005 | Lowrey | |
| 7,112,484 | B2 * | 9/2006 | Gilton ........................... | 438/237 |
| 2003/0156468 | A1 * | 8/2003 | Campbell et al. ............ | 365/200 |
| 2004/0224464 | A1 | 11/2004 | Gonzalez et al. | |
| 2006/0284237 | A1 | 12/2006 | Park et al. | |
| 2007/0111487 | A1 * | 5/2007 | Kim et al. .................... | 438/478 |
| 2008/0111120 | A1 | 5/2008 | Lee et al. | |
| 2008/0200014 | A1 | 8/2008 | Park et al. | |
| 2009/0001339 | A1 * | 1/2009 | Lee et al. ...................... | 257/2 |

OTHER PUBLICATIONS

Beckett, Paul, "Towards a Reconfigurable Nanocomputer Platform", *Proc. of the 7th Asia-Pacific Computer Systems Architectures Conference(ACSAC)*. Melbourne, Australia: ACS, (Jan. 2002),1-8.
Cho, Woo Y., et al., "A 0.18-um 3.0-V 64-Mb Nonvolatile Phase-Transition Random Access Memory (PRAM)", *IEEE Journal of Solid-State Circuits*, 40(1), (Jan. 2005),293-300.
Hwang, Y.N., "Phase-change chalcogenide nonvolatile RAM completely based on CMOS technology", *IEEE 2003 International Symposium on VLSI Technology, Systems, and Applications*, (2003),29-31.
Matsuzaki, N. , et al., "Oxygen-doped gesbte phase-change memory cells featuring 1.5 V/100-/spl mu/A standard 0.13/spl mu/m CMOS operations", *IEEE International Electron Devices Meetings, 2005. IEDM Technical Digest.*, (2005),738-741.
Oh, J. H., et al., "Full Integration of Highly Manufacturable 512Mb PRAM based on 90nm Technology", *IEEE International Electron Devices Meeting, 2006. IEDM '06.*, (2006),1-4.
"European Application Serial No. 09701855.0, Extended Search Report mailed Feb. 23, 2012", 8 pgs.

* cited by examiner

*Primary Examiner* — Julio J Maldonado
*Assistant Examiner* — Mohammad Choudhry
(74) *Attorney, Agent, or Firm* — Schwegman, Lundberg & Woessner, P.A.

(57) ABSTRACT

A variable-resistance material memory (VRMM) device includes a container conductor disposed over an epitaxial semiconductive prominence that is coupled to a VRMM. A VRMM device may also include a conductive plug in a recess that is coupled to a VRMM. A VRMM array may also include a conductive plug in a surrounding recess that is coupled to a VRMM. Apparatuses include the VRMM with one of the diode constructions.

16 Claims, 14 Drawing Sheets

3-D AND 3-D SCHOTTKY DIODE FOR CROSS-POINT, VARIABLE-RESISTANCE MATERIAL MEMORIES, PROCESSES OF FORMING SAME, AND METHODS OF USING SAME

TECHNICAL FIELD

This disclosure relates generally to variable-resistance material random-access memories.

BACKGROUND

Variable-resistance material memory structures often rely upon isolation of individual memory cells. The memory cells may be connected to a bit line in a parallel manner, and four metal layers, including the word line, bit line, top-electrode selection line, and the global data bus are used to program and read the data. The isolation of the individual memory cells creates tension for the designer to continue to miniaturize circuitry.

What are needed are methods to form better structures that can address these challenges. What are also needed are improved variable-resistance material random-access memory structures that can also address these challenges.

BRIEF DESCRIPTION OF THE DRAWINGS

The previously mentioned issues are addressed by the present disclosure and will be understood by reading and studying the following specification, of which the figures are a part.

DETAILED DESCRIPTION

The embodiments of a device, an apparatus, or an article described herein can be manufactured, used, or shipped in a number of positions and orientations. A variable-resistance material memory (VRMM) device may include a material such as an alloy. A VRMM device may include a material such as a quasi-metal composition. A VRMM device may include a material such as metal oxides. A VRMM device may include a material such as chalcogenides. These several materials can be very diverse in quality and performance.

Figure 1A:
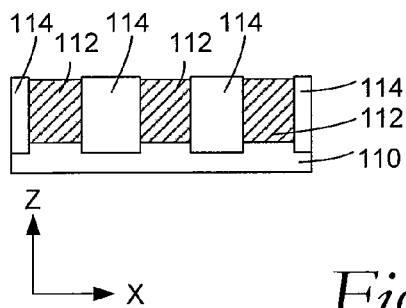
FIG. 1a shows a cross-section elevation and a top plan of a semiconductor device during fabrication according to an embodiment.
Figure 1A:
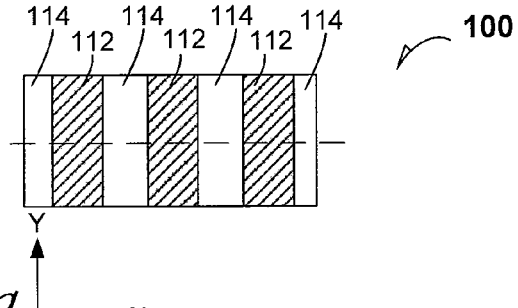

FIG. 1a shows a cross-section elevation and a top plan of a semiconductor device 100 during fabrication according to an embodiment. The semiconductor device 100 may be used in a memory device.

A substrate 110 such as a p-doped semiconductive material substrate has been formed such as a p-doped semiconductive material. Upon the substrate 110 an exposed semiconductive first film 112 is formed and patterned, and a shallow trench isolation (STI) 114 is filled between spaced-apart sections of the exposed semiconductive first film 112. In an embodiment the STI 114 is deposited and polished back such as with a chemical-mechanical polishing (CMP) process.

Figure 1B:
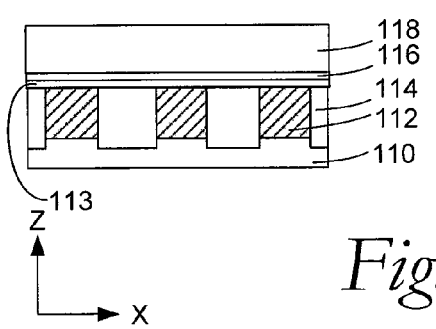
FIG. 1b shows a cross-section elevation and a top plan of the semiconductor device depicted in FIG. 1a during further fabrication according to an embodiment.
Figure 1B:
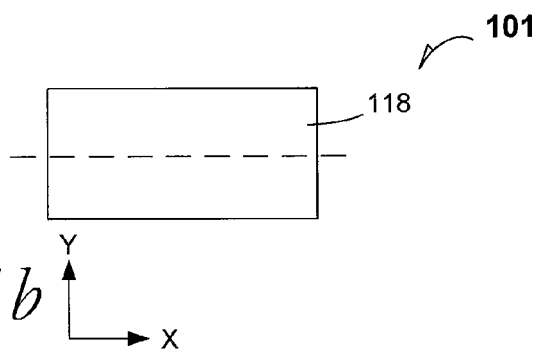

FIG. 1b shows a cross-section elevation and a top plan of the semiconductor device depicted in FIG. 1a during further fabrication according to an embodiment. The semiconductor device 101 has been overlaid with a silicon nitride film 116 and further overlaid with a dielectric first film 118 such as an oxide film formed by the decomposition of tetraethyl ortho silicate (TEOS). In an embodiment, an oxide film 113 may be located below the silicon nitride film 116 that may relieve stresses that can develop in the semiconductive first film 112.

Figure 1C:
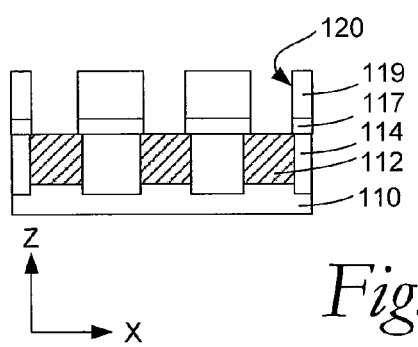
FIG. 1c shows a cross-section elevation and a top plan of the semiconductor device depicted in FIG. 1b during further fabrication according to an embodiment.
Figure 1C:
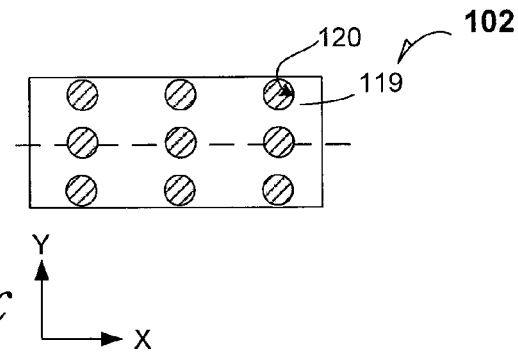

FIG. 1c shows a cross-section elevation and a top plan of the semiconductor device depicted in FIG. 1b during further fabrication according to an embodiment. The semiconductor device 102 has been further processed by patterning the silicon nitride film 116 and the dielectric first film 118 (FIG. 1b) to form a patterned silicon nitride film 117 and patterned dielectric film 119. Consequently, a recess 120 has been formed through the patterned silicon nitride film 117 and patterned dielectric film 119, and the exposed semiconductive first film 112 is exposed through the recess 120. The recess 120 is characterized by first and second walls and a floor.

Figure 1D:
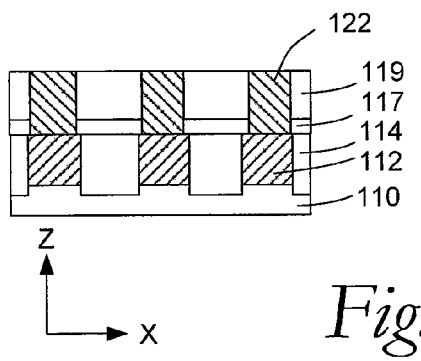
FIG. 1d shows a cross-section elevation and a top plan of the semiconductor device depicted in FIG. 1c during further fabrication according to an embodiment.
Figure 1D:
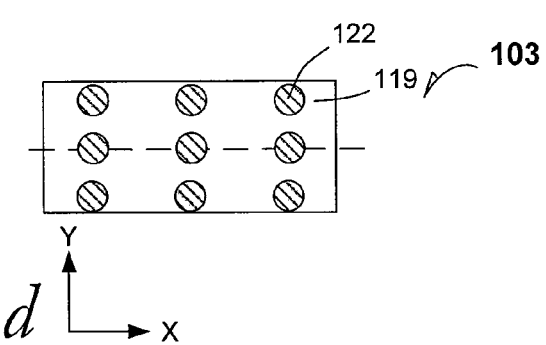

FIG. 1d shows a cross-section elevation and a top plan of the semiconductor device depicted in FIG. 1c during further fabrication according to an embodiment. The semiconductor device 103 has been further processed by forming an epitaxial semiconductive second film 122 upon the exposed semiconductive first film 112. In an embodiment, the epitaxial semiconductive second film 122 is formed by selective epitaxial growth (SEG) and may also be referred to as an epitaxial prominence 122. Thereafter, a CMP process may be used to secure the epitaxial semiconductive second film 122 at a flush relationship with the patterned dielectric film 119.

Figure 1E:
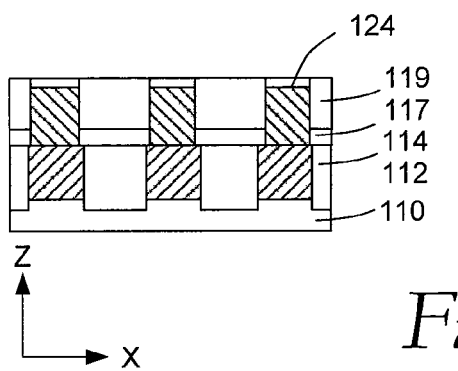
FIG. 1e shows a cross-section elevation and a top plan of the semiconductor device depicted in FIG. 1d during further fabrication according to an embodiment.
Figure 1E:
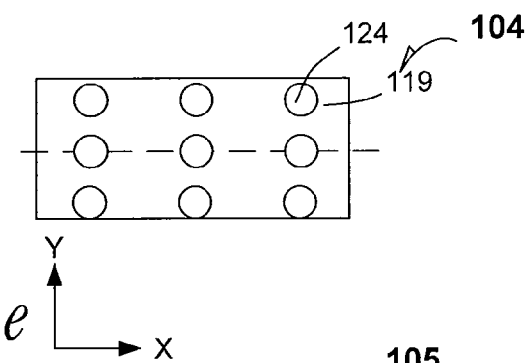

FIG. 1e shows a cross-section elevation and a top plan of the semiconductor device depicted in FIG. 1d during further fabrication according to an embodiment. The semiconductor device 104 has been further processed by etching back a portion of the epitaxial semiconductive second film 122 and by filling a conductive first film 124 into the recess that may result from the etchback.

Figure 1F:
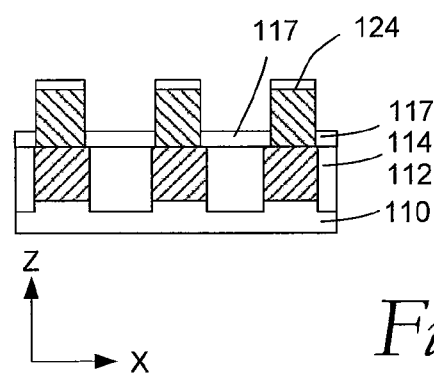
FIG. 1f shows a cross-section elevation and a top plan of the semiconductor device depicted in FIG. 1e during further fabrication according to an embodiment.
Figure 1F:
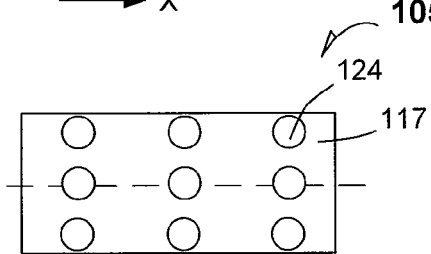

FIG. 1f shows a cross-section elevation and a top plan of the semiconductor device depicted in FIG. 1e during further fabrication according to an embodiment. The semiconductor device 105 has been further processed by etching back the patterned dielectric film 119 such that the patterned silicon nitride film 117 is exposed. In an embodiment, removal of the patterned dielectric film 119 is done by a wet isotropic etch that is selective to leaving the semiconductive material of the epitaxial prominence 122.

Figure 1G:
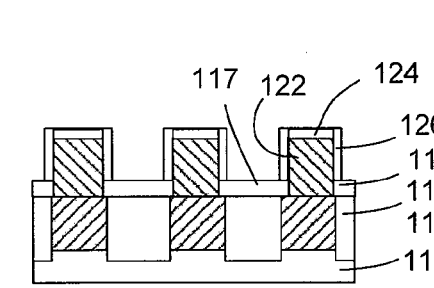
FIG. 1g shows a cross-section elevation and a top plan of the semiconductor device depicted in FIG. 1f during further fabrication according to an embodiment.
Figure 1G:
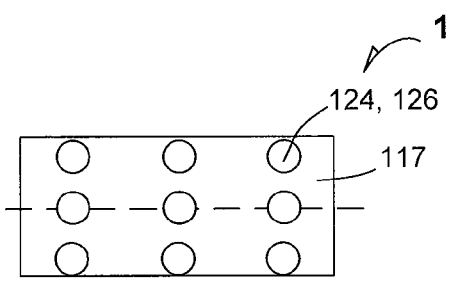

FIG. 1g shows a cross-section elevation and a top plan of the semiconductor device depicted in FIG. 1f during further fabrication according to an embodiment. The semiconductor device 106 has been further processed by forming a conductive second film 126 over the epitaxial semiconductive second film 122, the patterned silicon nitride film 117, and the conductive first film 124. FIG. 1g shows the result of a spacer etch that has removed significantly all conductive material that is exposed from the z-direction. Consequently a Schottky diode metal film 124, 126 remains after the spacer etch, and the epitaxial prominence 122 remains as the etch is timed to remove significant portions of the metal that was exposed from the z-direction of the conductive second film 126. As a result, a container conductor 124, 126 is another description of the Schottky diode metal film 124, 126. The conductive first film 124 may be referred to as a lid 124 and the conductive second film 126 may be referred to as a cylinder 126 when the epitaxial prominence 122 is patterned as a solid cylinder. Consequently, the Schottky diode metal film 124, 126 may be referred to as a lid 124 and a cylinder 126.

In an embodiment, the conductive first film 124 may be a non-metal such as a semiconductive material, as well as the third film 126. Consequently, the metal film 124, 126 is part of a diode without metal. As a result, a container conductor 124, 126 is another description of a diode third film 124, 126 that forms a diode with the epitaxial semiconductive second film 122.

Figure 1H:
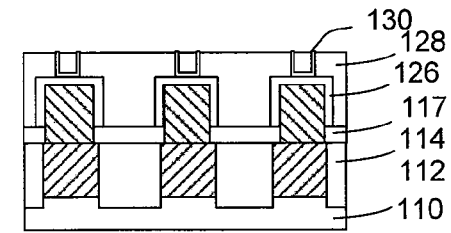
FIG. 1h shows a cross-section elevation and a top plan of the semiconductor device depicted in FIG. 1g during further fabrication according to an embodiment.
Figure 1H:
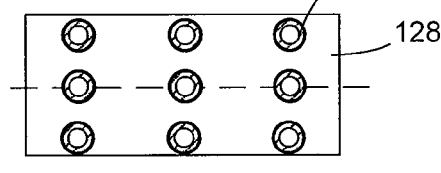

FIG. 1h shows a cross-section elevation and a top plan of the semiconductor device depicted in FIG. 1g during further fabrication according to an embodiment. The semiconductor device 107 has been further processed by forming a dielectric second film 128 over the Schottky diode metal third film 124, 126. The dielectric second film 128 has also been patterned, and an electrode 130 has been filled into to the patterned area in contact with the Schottky diode metal third film 124, 126.

Figure 1J:
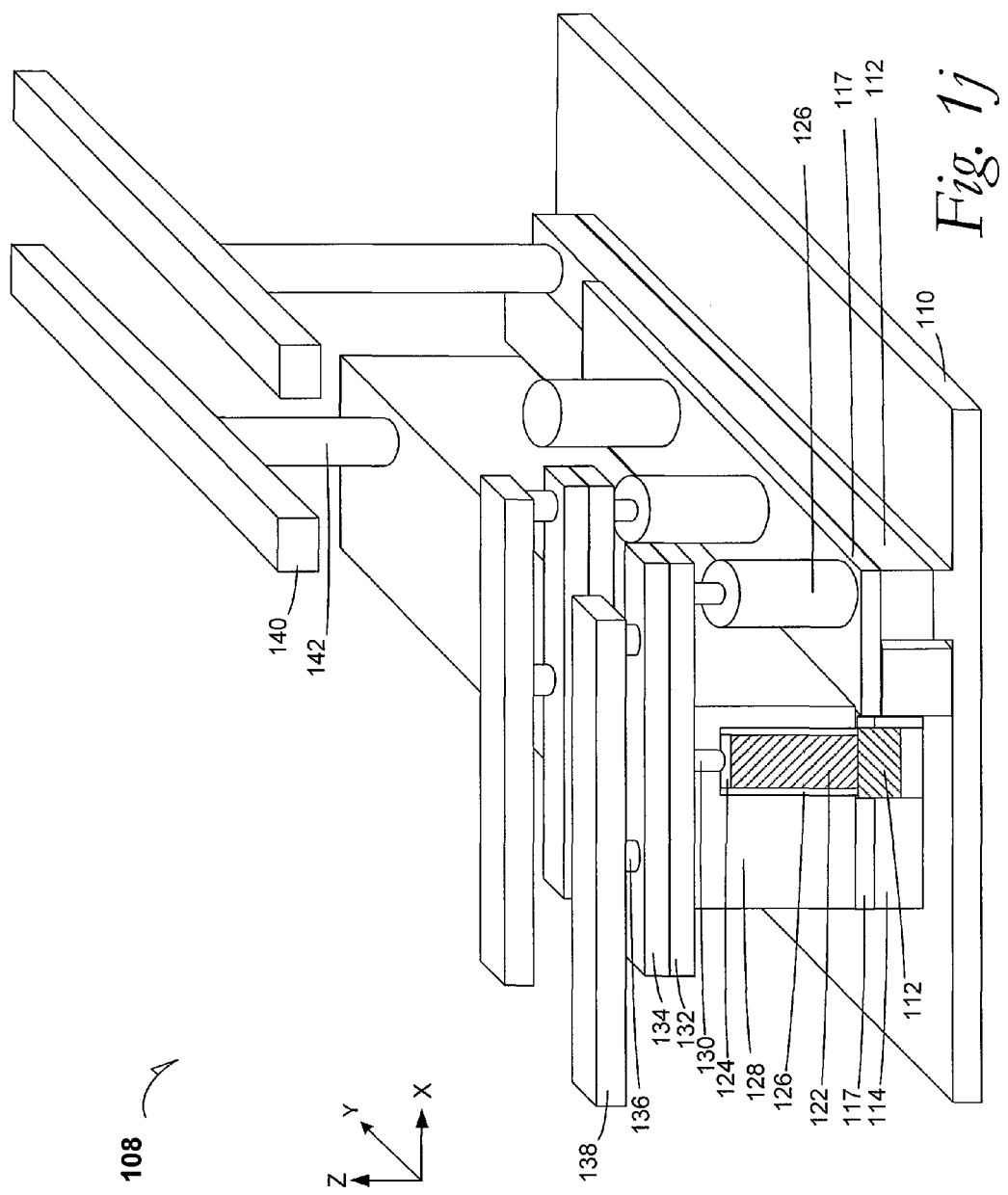
FIG. 1j is a cut-away perspective view of the semiconductor device depicted in FIGS. 1a through 1h after further processing according to an embodiment.

FIG. 1j is a cut-away perspective view of the semiconductor device depicted in FIGS. 1a through 1h after further processing according to an embodiment. The substrate 110 supports the exposed semiconductive first film 112, the STI 114, and the patterned silicon nitride film 117. The epitaxial semiconductive second film 122 is disposed upon the exposed semiconductive first film 112, and the conductive first film 124 and the conductive second film 126 form the conductive third film 112, 124 over the epitaxial prominence 122.

In an embodiment, the conductive first film 124 may be a non-metal such as a semiconductive material, as well as the third film 126. Consequently, the third film 124, 126 would be merely part of a diode.

The electrode 130 makes contact with a VRMM cell 132 such as a phase-change chalcogenide cell. A top electrode 134 contacts the VRMM cell 132, and a bit line contact 136 contacts both a bit line 138 and the top electrode 134. In an embodiment, the top electrode 134 is composed of titanium nitride. FIG. 1j also illustrates a word line strap 140 that is coupled to the VRMM cell 132 through a word line contact 142.

According to an embodiment, the device 108 may be referred to as a 3-dimensional epitaxial diode device, or in the case where the third film 124, 126 is a metal, a 3-dimensional epitaxial Schottky diode device. In a 90 nanometer process for forming a VRMM cell 132, if the height of the epitaxial prominence 122 is about 270 nm, current drive may be about 12 times that of a planar Schottky diode of a similar footprint. It can be seen that beside cell isolation, more current may be available for the same footprint of a given VRMM cell.

Figure 2A:
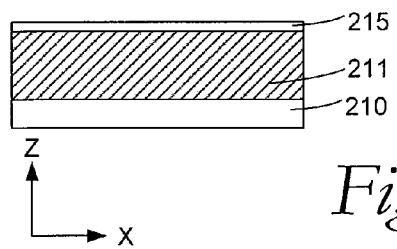
FIG. 2a shows a cross-section elevation and a top plan of a semiconductor device during fabrication according to an embodiment.
Figure 2A:
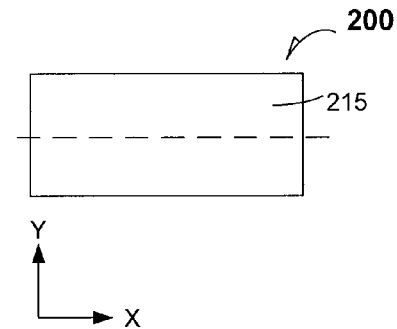

FIG. 2a shows a cross-section elevation and a top plan of a semiconductor device 200 during fabrication according to an embodiment. The semiconductor device 200 may be used in a memory device.

A substrate 210 has been formed such as a p-doped semiconductive material. Upon the substrate a semiconductive first film 211 is formed, and a silicon nitride film 215 is formed above the semiconductive first film 211.

Figure 2B:
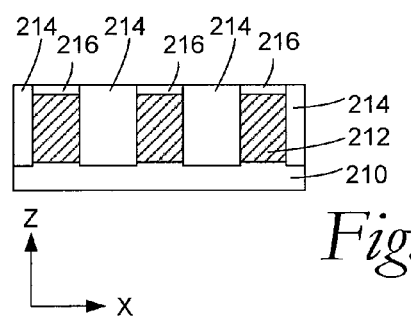
FIG. 2b shows a cross-section elevation and a top plan of the semiconductor device depicted in FIG. 2a during further fabrication according to an embodiment.
Figure 2B:
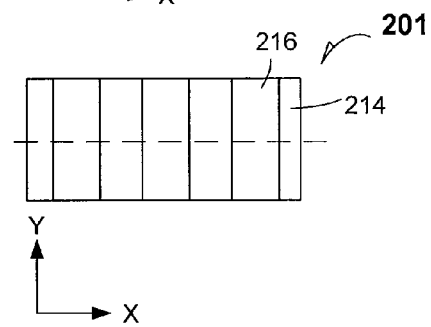

FIG. 2b shows a cross-section elevation and a top plan of the semiconductor device depicted in FIG. 2a during further fabrication according to an embodiment. The semiconductor device 201 has been processed such that the semiconductive first film 211 and the silicon nitride film 215 (FIG. 2a) are a first-patterned semiconductive film 212 and a first-patterned silicon nitride film 216, respectively. Further, a STI 214 is filled between spaced-apart sections of the first-patterned semiconductive film 212. In an embodiment, the STI 214 is deposited and polished back such as with a CMP process. In an embodiment, the first-patterned semiconductive film 212 is referred to as an island (viewed in cross-section; otherwise as a strip). As depicted, the island 212 has a first height.

Figure 2C:
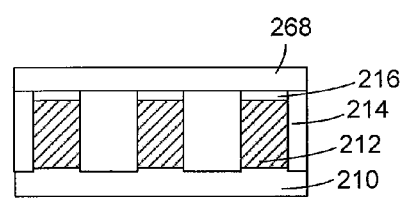
FIG. 2c shows a cross-section elevation and a top plan of the semiconductor device depicted in FIG. 2b during further fabrication according to an embodiment.
Figure 2C:
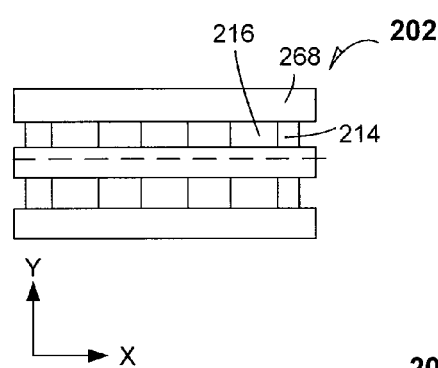

FIG. 2c shows a cross-section elevation and a top plan of the semiconductor device depicted in FIG. 2b during further fabrication according to an embodiment. The semiconductor device 202 has been processed such that the first-patterned semiconductive film 212, the first-patterned silicon nitride film 216, and the STI 214 are further overlaid with a mask 268 that is used to create a cross-pattern that is orthogonal (running in the X-direction) to the structure of the first-patterned semiconductive film 212 (running in the Y-direction).

Figure 2D:
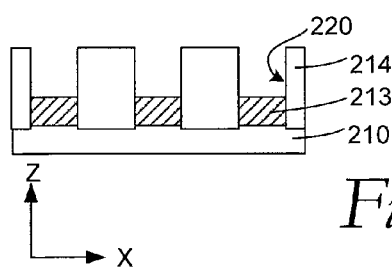
FIG. 2d shows a cross-section elevation and a top plan of the semiconductor device depicted in FIG. 2c during further fabrication according to an embodiment.
Figure 2D:
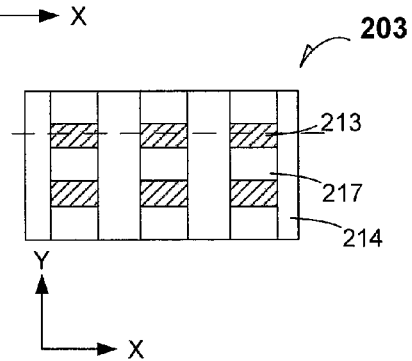

FIG. 2d shows a cross-section elevation and a top plan of the semiconductor device depicted in FIG. 2c during further fabrication according to an embodiment. The semiconductor device 203 has been further processed by etching through the mask 268 (FIG. 2c) to form a second-patterned semiconductive film 213 as well as a second-patterned silicon nitride film 217. Consequently, a recess 220 has been formed through the second-patterned silicon nitride film 217. The second-patterned semiconductive film 213 is exposed through the recess 220. In an embodiment, the second-patterned semiconductive film 213 is referred to as an island that has an island second height that is less than the island first height.

Figure 2E:
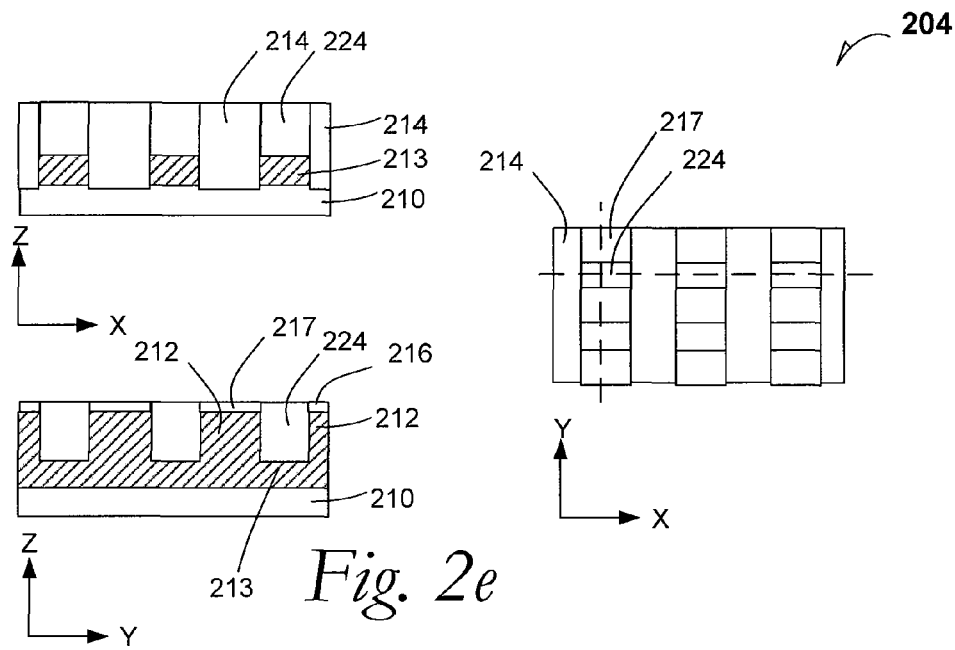
FIG. 2e shows two cross-section elevations and a top plan of the semiconductor device depicted in FIG. 2d during further fabrication according to an embodiment.

FIG. 2e shows two cross-section elevations and a top plan of the semiconductor device depicted in FIG. 2d during further fabrication according to an embodiment. The semiconductor device 204 has been further processed by filling a diode plug 224 into the recess 220 (FIG. 2d). In the X-Z view, the diode plug 224 contacts the second-patterned semiconductive film 213 from the positive Z-direction. In the Z-Y, view the diode plug 224 contacts the first-patterned semiconductive film 212 from Y-direction and also contacts the second-patterned semiconductive film 213. The diode plug 224 seats upon the floor that is the island second height at 213. From the plan view, the diode plug 224 appears interspersed among the second-patterned silicon nitride film 217.

Figure 2F:
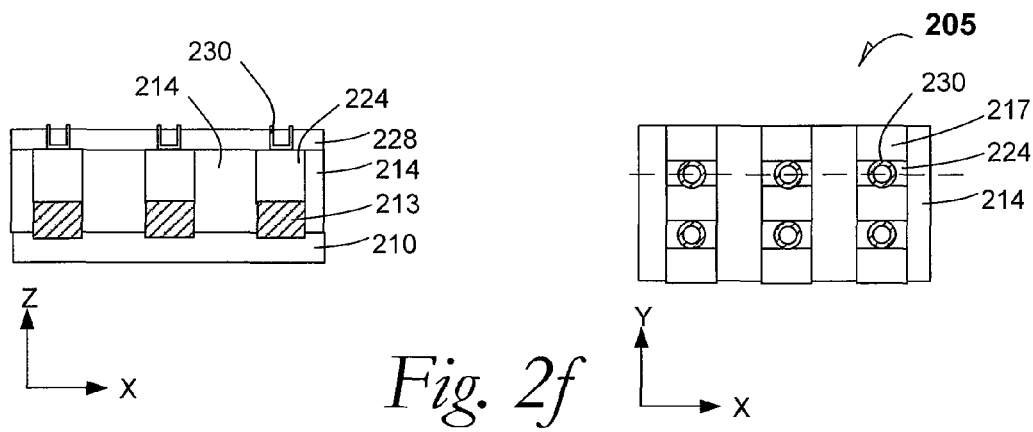
FIG. 2f shows a cross-section elevation and plan of the semiconductor device depicted in FIG. 2e during further fabrication according to an embodiment.

FIG. 2f shows a cross-section elevation and plan of the semiconductor device depicted in FIG. 2e during further fabrication according to an embodiment. The semiconductor device 205 has been further processed by forming a dielectric second film 228 over the diode plug 224, followed by a patterning thereof, and the formation of an electrode 230 that has been filled into to the patterned area and in contact with the diode plug 224.

Figure 2G:
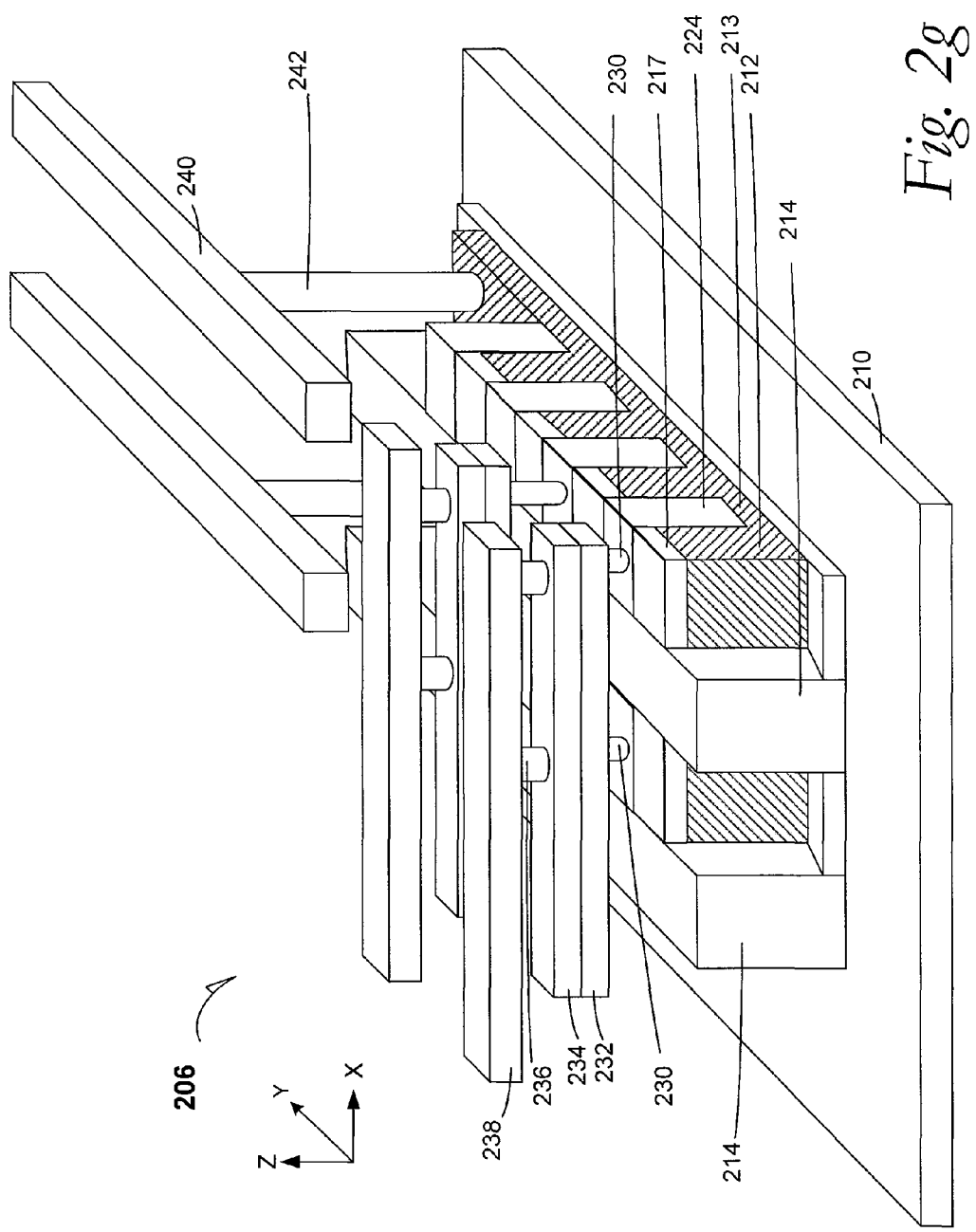
FIG. 2g is a cut-away perspective view of the semiconductor device depicted in FIGS. 2a through 2f after further processing according to an embodiment.

FIG. 2g is a cut-away perspective view of the semiconductor device depicted in FIGS. 2a through 2f after further processing according to an embodiment. According to an embodiment, the device 206 may be referred to as a 3-dimensional recess diode device, or in the case where the diode plug 224 is a metal, a 3-dimensional recess Schottky diode device. In a 90 nanometer process for forming a VRMM cell 232, if the height of the diode plug 224 is about 270 nm, current drive may be about 7 times that of a planar Schottky diode of a similar footprint.

The substrate 210 supports the first-patterned semiconductive film 212, the second-patterned semiconductive film 213, the STI 214, and the second-patterned silicon nitride film 217. The diode plug 224, when it is a metal, makes a Schottky-type diode with each of the first-patterned semiconductive film 212 and the second-patterned semiconductive film 213. In an embodiment, the diode plug 224 may be a non-metal such as a semiconductive material. Consequently, the diode plug 224 and the second-patterned semiconductive film 213 and the first-patterned semiconductive film 212 form merely part of a diode.

The electrode 230 makes contact with the VRMM cell 232 such as a phase-change chalogenide cell. A top electrode 234 contacts the VRMM cell 232, and a bit line contact 236 contacts both a bit line 238 and the top electrode 234. In an embodiment, the top electrode 234 is composed of titanium nitride. FIG. 2g also illustrates a word line strap 240 that is coupled to the VRMM cell 232 through a word line contact 242.

According to an embodiment, the device 206 may be referred to as a 3-dimensional recess diode device, or in the case where the diode plug 224 is a metal, a 3-dimensional recess Schottky diode device. In a 90 nanometer process for forming a VRMM cell, if the height of the diode plug 224 is about 270 nm, current drive may be about 7 times that of a planar Schottky diode of a similar footprint.

Figure 3A:
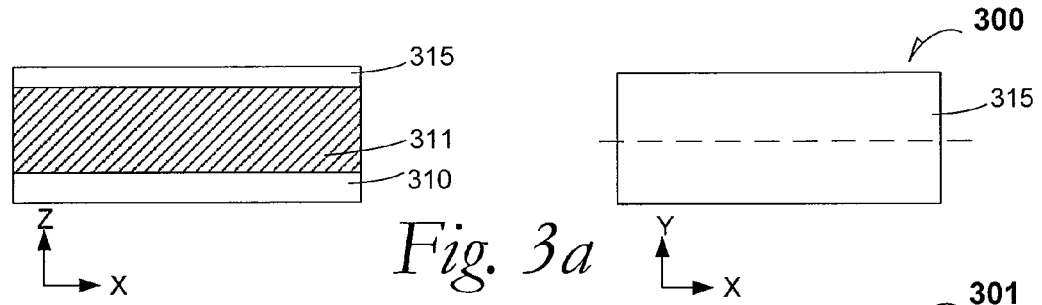
FIG. 3a shows a cross-section elevation and a top plan of a semiconductor device during fabrication according to an embodiment.

FIG. 3a shows a cross-section elevation and a top plan of a semiconductor device 300 during fabrication according to an embodiment. The semiconductor device 300 may be used in a memory device.

A substrate 310 has been formed such as a p-doped semiconductive material. Upon the substrate 310 a semiconductive film 311 is formed and a silicon nitride film 315 is formed above the semiconductive film 311.

Figure 3B:
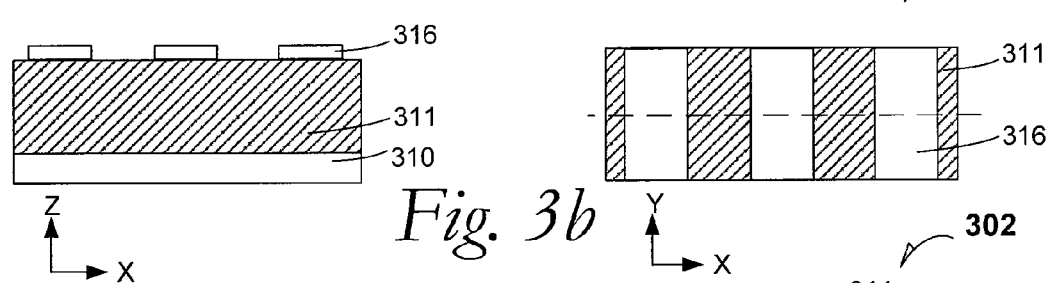
FIG. 3b is a cross-section elevation of the semiconductor device depicted in FIG. 3a according to a method embodiment.

FIG. 3b shows a cross-section elevation and a top plan of the semiconductor device depicted in FIG. 3a during further fabrication according to an embodiment. The semiconductor device 301 has been processed such that the silicon nitride film 315 (FIG. 3a) is a first-patterned silicon nitride film 316.

Figure 3C:
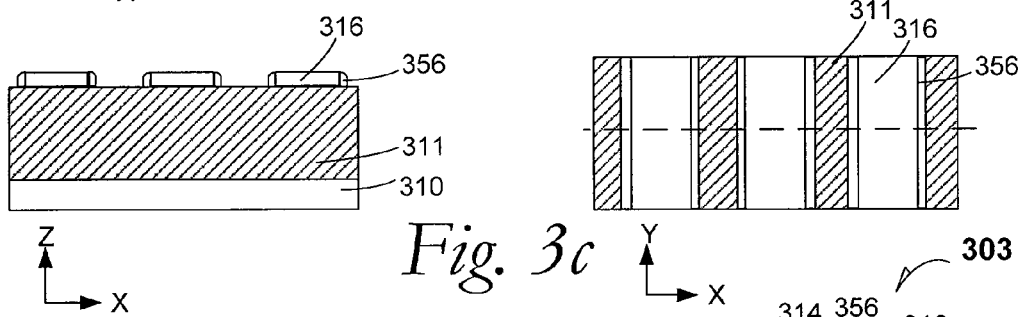
FIG. 3c is a cross-section elevation of the semiconductor device depicted in FIG. 3b according to a method embodiment.

FIG. 3c shows a cross-section elevation and a top plan of the semiconductor device depicted in FIG. 3b during further fabrication according to an embodiment. The semiconductor device 302 has been processed such that a spacer 356 has been formed on lateral exposures of the first-patterned silicon nitride film 316, and the spacer 356 is also resting upon the vertical exposure of the semiconductive film 311. In an embodiment, the spacer 356 is an oxide spacer.

Figure 3D:
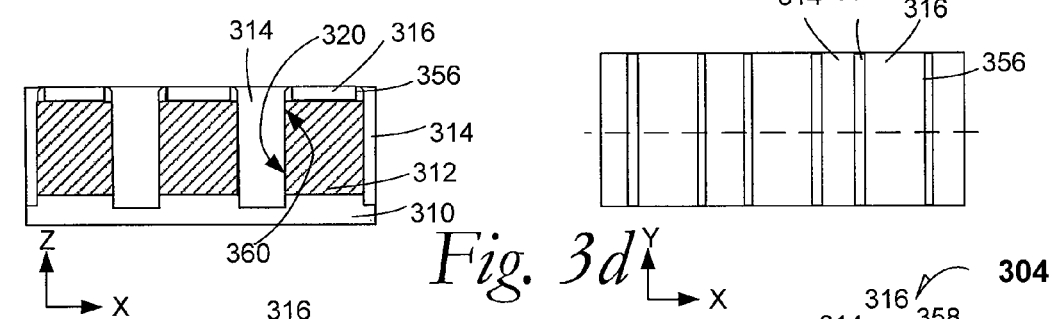
FIG. 3d shows a cross-section elevation and a top plan of the semiconductor device depicted in FIG. 3c during further fabrication according to an embodiment.

FIG. 3d shows a cross-section elevation and a top plan of the semiconductor device depicted in FIG. 3c during further fabrication according to an embodiment. The semiconductor device 303 has been processed such that the semiconductive film 311 (FIG. 3c) has been patterned to be a first-patterned semiconductive film 312, and an STI 314 has been filled into a first recess 320 that was formed during formation of the first-patterned semiconductive film 312. In an embodiment, the first-patterned semiconductive film 312 is referred to as an island. The STI 314 exhibits an STI facet 360 by virtue of the spacer 356 during the fill of the STI 314 into the recess 320.

Figure 3E:
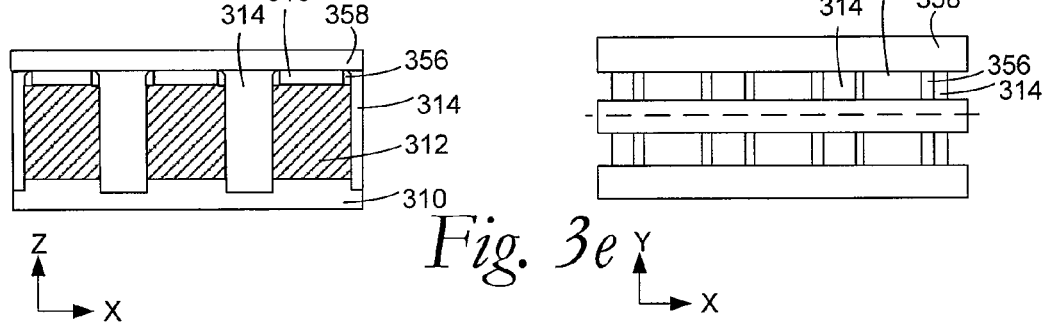
FIG. 3e shows a cross-section elevation and a top plan of the semiconductor device depicted in FIG. 3d during further fabrication according to an embodiment.

FIG. 3e shows a cross-section elevation and a top plan of the semiconductor device depicted in FIG. 3d during further fabrication according to an embodiment. The semiconductor device 304 has been overlaid with a mask 358 that is used to create a cross-pattern that is orthogonal (running in the X-direction) to the structure of the first-patterned semiconductive film 312 (running in the Y-direction).

Figure 3F:
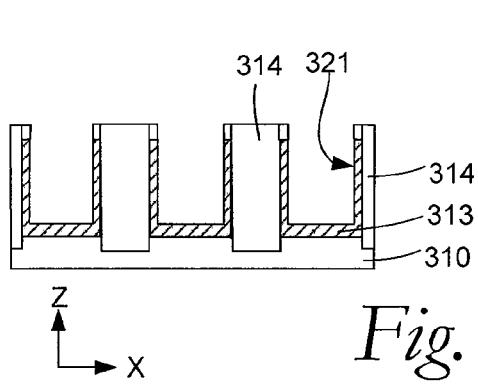
FIG. 3f shows a cross-section elevation and a top plan of the semiconductor device depicted in FIG. 3e during further fabrication according to an embodiment.
Figure 3F:
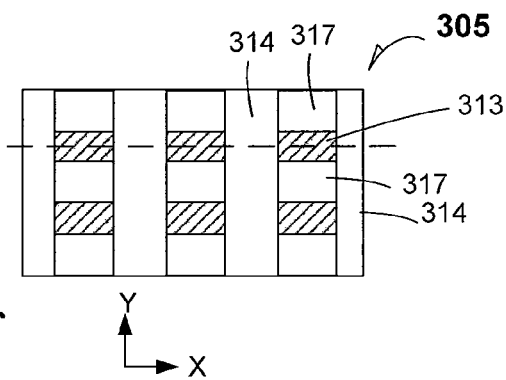

FIG. 3f shows a cross-section elevation and a top plan of the semiconductor device depicted in FIG. 3e during further fabrication according to an embodiment. The semiconductor device 305 has been further processed by etching through the mask 358 (FIG. 3e) to form a second-patterned semiconductive film 313 with a second recess 321. Further, the etching by virtue of the spacer 356 has left the second-patterned semiconductive film 313 as well as a second-patterned silicon nitride film 317. Consequently, the second recess 321 has been formed through the second-patterned silicon nitride film 317. The second-patterned semiconductive film 313 is exposed through the second recess 321.

Figure 3G:
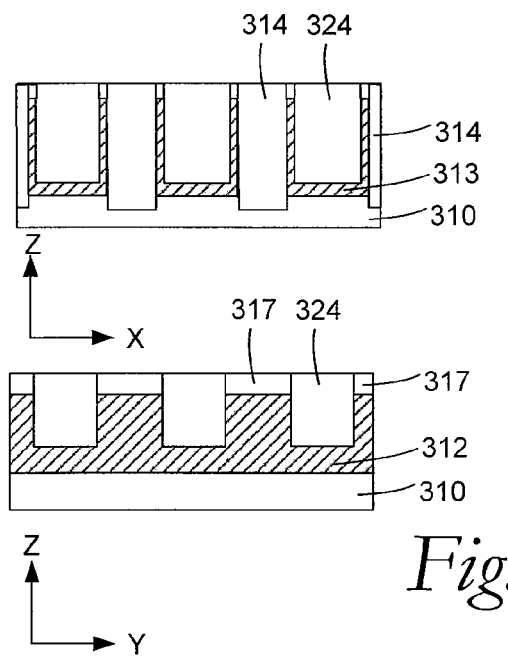
FIG. 3g shows two cross-section elevations and a top plan of the semiconductor device depicted in FIG. 3f during further fabrication according to an embodiment.
Figure 3G:
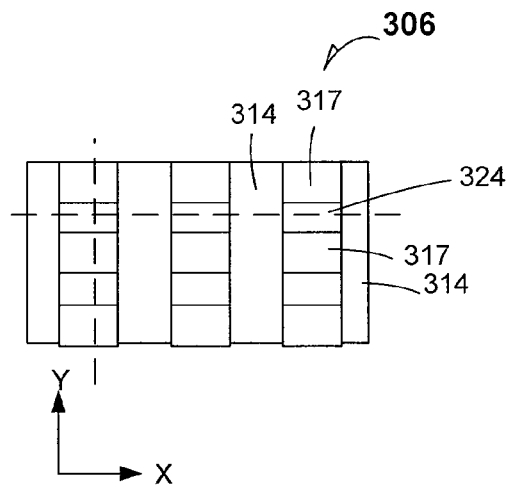

FIG. 3g shows two cross-section elevations and a top plan of the semiconductor device depicted in FIG. 3f during further fabrication according to an embodiment. The semiconductor device 306 has been further processed by filling a diode plug 324 into the second recess 321 (FIG. 3f). In the X-Z elevation, the diode plug 324 contacts the second-patterned semiconductive film 313 at three surfaces including first- and second walls that have lateral-exposure surfaces, and also a floor that is a vertical-exposure surface. In the Y-Z elevation, the diode plug 324 contacts the second-patterned semiconductive film 313, also at three surfaces including two lateral-exposure surfaces and also a vertical-exposure surface from the positive Z-direction. From the plan view, the diode plug 324 appears interspersed among the second-patterned silicon nitride film 317.

Figure 3H:
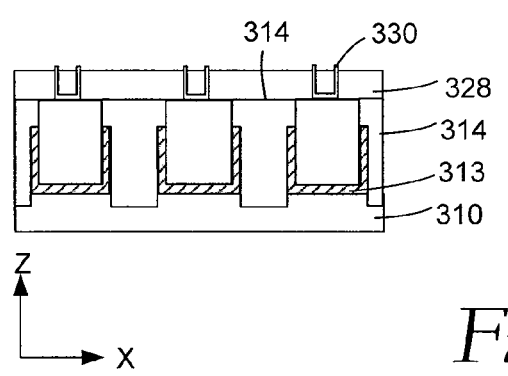
FIG. 3h shows a cross-section elevation and plan of the semiconductor device depicted in FIG. 3g during further fabrication according to an embodiment.
Figure 3H:
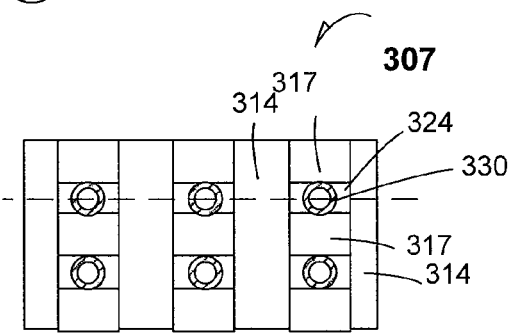

FIG. 3h shows a cross-section elevation and plan of the semiconductor device depicted in FIG. 3g during further fabrication according to an embodiment. The semiconductor device 307 has been further processed by forming a dielectric second film 328 over the diode plug 324, followed by a patterning thereof, and the formation of an electrode 330 that has been filled into the patterned area and is in contact with the diode plug 324.

Figure 3J:
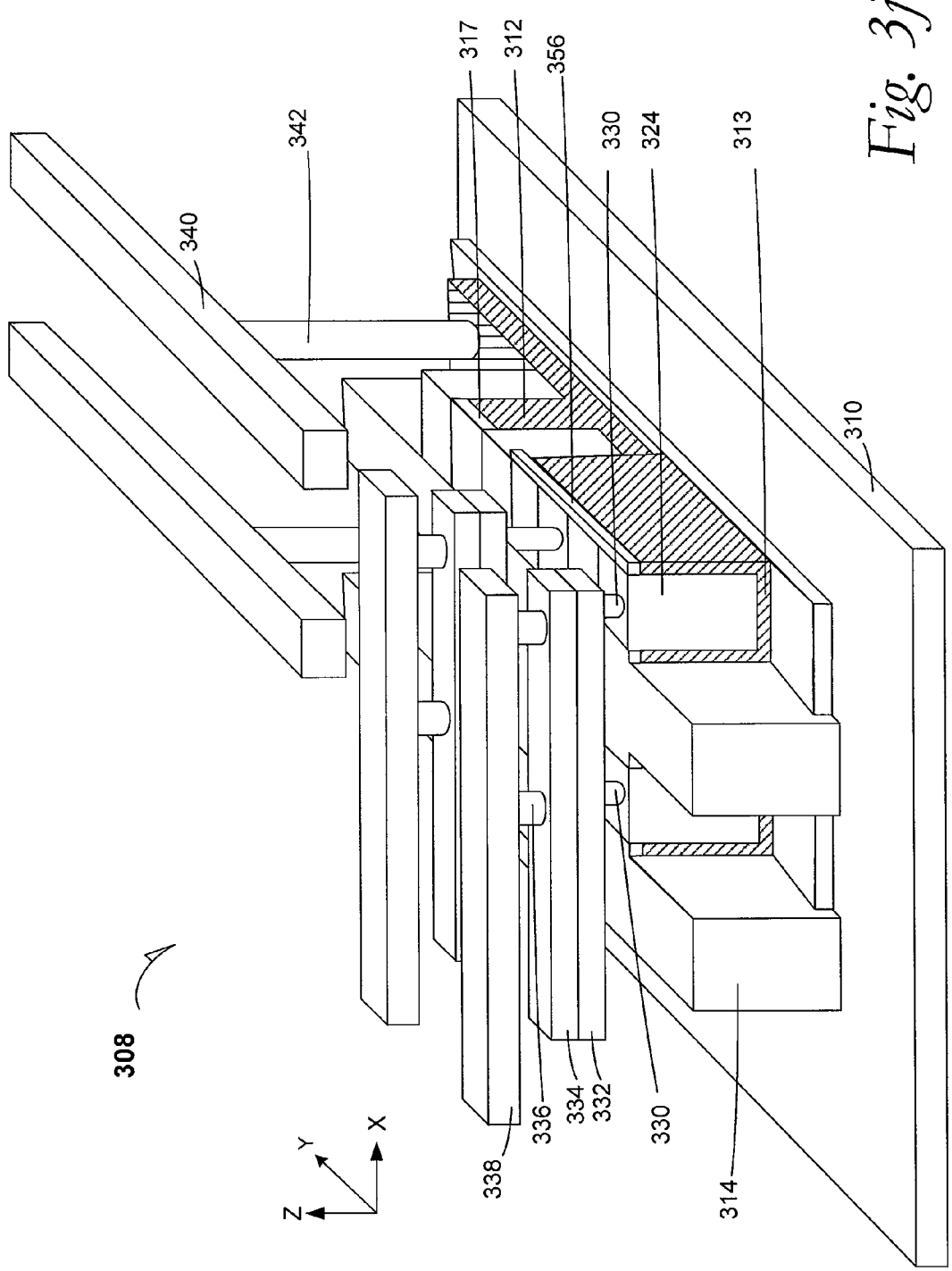
FIG. 3j is a cut-away perspective view of the semiconductor device depicted in FIGS. 3a through 3h after further processing according to an embodiment.

FIG. 3j is a cut-away perspective view of the semiconductor device depicted in FIGS. 3a through 3h after further processing according to an embodiment. According to an embodiment, the device 308 may be referred to as a 3-dimensional surrounding-recess diode device, or in the case where the diode plug 324 is a metal, a 3-dimensional surrounding-recess Schottky diode device. In a 90 nanometer process for forming a VRMM cell 332, if the height of the diode plug 324 is about 270 nm, current drive may be about 13 times that of a planar Schottky diode of a similar footprint.

The substrate 310 supports the second-patterned semiconductive film 313, the STI 314, and the second-patterned silicon nitride film 317. The diode plug 324, when it is a metal, makes a Schottky-type diode with each contacted surface of the second-patterned semiconductive film 313. In an embodiment, the diode plug 324 may be a non-metal such as a semiconductive material. Consequently, the diode plug 324 and the second-patterned semiconductive film 313 form merely part of a diode.

The electrode 330 makes contact with the VRMM cell 332 such as a phase-change chalogenide cell. A top electrode 334 contacts the VRMM cell 332, and a bit line contact 336 contacts both a bit line 338 and the top electrode 334. In an embodiment, the top electrode 334 is composed of titanium nitride.

FIG. 3j also illustrates a word line strap 340 that is coupled to the VRMM cell 332 through a word line contact 342.

Several variable-resistance memory materials may be used for the several VRMM cells. In an embodiment, the variable-resistance memory material that may be used as a PCRAM cell is a gallium (Ga) containing material. Selected gallium-containing materials that may be used include GaSb, Ga—Ge—Sb, Ga—Se—Te, and others. In some gallium-containing phase-change material embodiments, the gallium is present in a majority amount (greater than or equal to 50 percent). In some gallium-containing phase-change material embodiments, the gallium is present in a plurality amount (gallium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a germanium (Ge) containing material. Selected germanium-containing materials that may be used include Ge—Te, Ge—Sb—Te, Ge—Te—As, Ge—Se—Ga, Ge—In—Sb, Ge—Te—Sb—S, Ge—Te—SnO, Ge—Te—Sn—Au, Ge—Pd—Te—Sn, Ge—Sb—Te—Pd, Ge—Sb—Te—Co, Ge—Sb—Se—Te, Ge—Sn—Te, Ge—Te—Sn—Ni, Ge—Te—Sn—Pd, Ge—Te—Sn—Pt, and others. In some germanium-containing phase-change material embodiments, the germanium is present in a majority amount (greater than or equal to 50 percent). In some germanium-containing phase-change material embodiments, the germanium is present in a plurality amount (germanium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an indium (In) containing material. Selected indium-containing materials that may be used include In—Se, In—Sb, In—Sb—Te, In—Sb—Ge, In—Se—Ti—Co, In—Ag—Sb—Te, and others. In some indium-containing phase-change material embodiments, the indium is present in a majority amount (greater than or equal to 50 percent). In some indium-containing phase-change material embodiments, the indium is present in a plurality amount (indium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an antimony (Sb) containing material. Selected antimony-containing materials that may be used include $Sb_2Te_3$, Sb—Ga, Sb—Bi—Se, Sb—Sn—Te, Sb—In—Ge, Sb—Te—Ge—S, Sb—Ge—Te—Pd, Sb—Ge—Te—Co, Sb—Te—Bi—Se, Sb—Ag—In—Te, Sb—Ge, Sb—Ge—Se—Te, Sb—Ge—Sn—Te, and others. In some antimony-containing phase-change material embodiments, the antimony is present in a majority amount (greater than or equal to 50 percent). In some antimony-containing phase-change material embodiments, the antimony is present in a plurality amount (antimony being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a tellurium (Te) containing material. Selected tellurium-containing materials that may be used include Te—Ge, Te—Sb, Te—As, Te—Al, Te—Ge—Sb, Te—Ge—As, Te—In—Sb, Te—Sn—Se, Te—Ga—Se, Te—Sn—Sb, Te—Ge—Sb—S, Te—Ge—Sn—O, Te—Ge—Sn—Au, Te—Pd—Ge—Sn, Te—Ge—Sb—Pd, Te—Ge—Sb—Co, Te—Sb—Bi—Se, Te—Ag—In—Sb, Te—Ge-Ab-Se, Te—Ge—Sn—Sb, Te—Ge—Sn—Ni, Te—Ge—Sn—Pd, Te—Ge—Pd—Pt, and others. In some tellurium-containing phase-change material embodiments, the tellurium is present in a majority amount (greater than or equal to 50 percent). In some tellurium-containing phase-change material embodiments, the tellurium is present in a plurality amount (tellurium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a selenium (Se) containing material. Selected selenium-containing materials that may be used include Se—In, Se—Te—Sn, Se—Ge—Ga, Se—Bi—Sb, Se—Ga—Te, Se—In—Ti—Co, Se—Sb—Te—Bi, Se—Ge—Sb—Te, and others. In some selenium-containing phase-change material embodiments, the selenium is present in a majority amount (greater than or equal to 50 percent). In some selenium-containing phase-change material embodiments, the selenium is present in a plurality amount (selenium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an arsenic (As) containing material. Selected arsenic-containing materials that may be used include As—Te, As—Te—Ge, and others. In some arsenic-containing phase-change material embodiments, the arsenic is present in a majority amount (greater than or equal to 50 percent). In some arsenic-containing phase-change material embodiments, the arsenic is present in a plurality amount (arsenic being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an aluminum (Al) containing material. Selected aluminum-containing materials that may be used include Al—Te, Al—Se, and others. In some aluminum-containing phase-change material embodiments, the arsenic is aluminum in a majority amount.

In an embodiment, the variable-resistance material that may be used as a PCRAM cell is a tin (Sn) containing material. Selected tin-containing materials that may be used include Sn—Te—Se, Sn—Sb—Te, Sn—Te—Ge—O, Sn—Pd—Te—Ge, Sn—Ge—Sb—Te, Sn—Ge—Sb—Te, Sn—Ge—Te—Ni, Sn—Ge—Te—Pd, Sn—Ge—Te—Pt, and others. In some tin-containing phase-change material embodiments, the tin is present in a majority amount (greater than or equal to 50 percent). In some tin-containing phase-change material embodiments, the tin is present in a plurality amount (tin being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a palladium (Pd) containing material. Selected palladium-containing materials that may be used include Pd—Te—Ge—Sn, Pd—Ge—Sb—Te, and others. In some palladium-containing phase-change material embodiments, the palladium is present in a majority amount (greater than or equal to 50 percent). In some palladium-containing phase-change material embodiments, the palladium is present in a plurality amount (palladium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a silver (Ag) containing material. Selected silver-containing materials that may be used include Ag—In—Sb—Te and others. In some silver-containing phase-change material embodiments, the silver is present in a majority amount (greater than or equal to 50 percent). In some silver-containing phase-change material embodiments, the silver is present in a plurality amount (silver being the most prevalent element). In some embodiments, the first-listed element is present in either a majority or plurality amount, and the subsequent-listed elements are listed by order of decreasing amounts on an elemental scale.

In an embodiment, the variable-resistance material may include one of various materials used to form so-called "colossal magnetoresistive films" such as, for example, $Pr_{(1-x)}Ca_xMnO_3$ (PCMO), $La_{(1-x)}Ca_xMnO_3$ (LCMO), and $Ba_{(1-x)}Sr_xTiO_3$.

In an embodiment, the variable-resistance material may include a binary or ternary doped or undoped oxide material such as, for example, $Al_2O_3$, $BaTiO_3$, $SrTiO_3$, $Nb_2O_5$, $SrZrO_3$, $TiO_2$, $Ta_2O_5$, NiO, $ZrO_x$, $HfO_x$, and $Cu_2O$.

In an embodiment, the variable-resistance material may have a Perovskite structure.

In an embodiment, the variable-resistance material includes a doped chalcogenide glass of the general formula $A_xB_y$, where B is selected from sulfur (S), selenium (Se), and tellurium (Te), and mixtures thereof, and where A includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) with one or more dopants selected from noble metal and transition metal elements such as, for example, Au, Ag, Pt, Cu, Cd, In, Ru, Co, Cr, Ni, Mn, and Mo.

Figure 4:
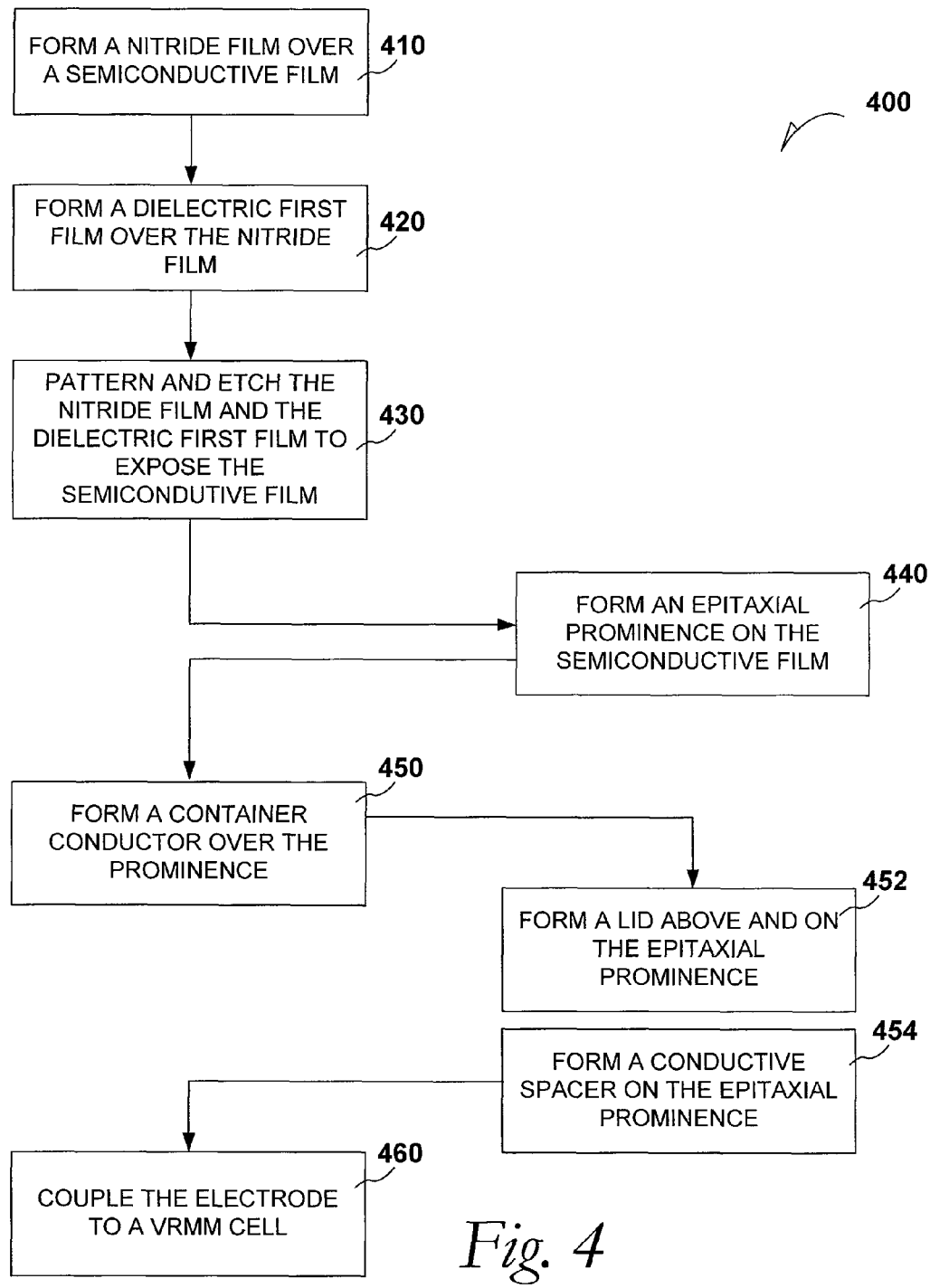
FIG. 4 is a process flow diagram for fabricating a 3-dimensional epitaxial Schottky diode device for a variable-resistance material memory according to an embodiment.

FIG. 4 is a process flow diagram 400 for fabricating a 3-dimensional epitaxial Schottky diode device for a variable-resistance material memory according to an embodiment.

At 410, the process includes forming a nitride film over a semiconductive film.

At 420, the process includes forming a dielectric first film over the nitride film.

At 430, the process includes patterning and etching through the nitride film and the dielectric first film to expose the semiconductive film.

At 440, the process includes forming an epitaxial prominence on the semiconductive film.

At 450, the process includes forming a container over the epitaxial prominence.

At 452, the process may include forming a lid above and on the epitaxial prominence. The lid may act as a hard mask for removing the dielectric first film, down to the nitride film.

At 454, the process includes forming a conductive spacer on the epitaxial prominence. The conductive spacer may be spacer etched such that the lid and the conductive spacer amount to the container conductor. In an embodiment the process may commence at 440 and terminate at 454.

At 460, the process includes forming an electrode on the conductive spacer, and coupling the electrode to a VRMM cell such as a chalcogenide material cell.

Figure 5:
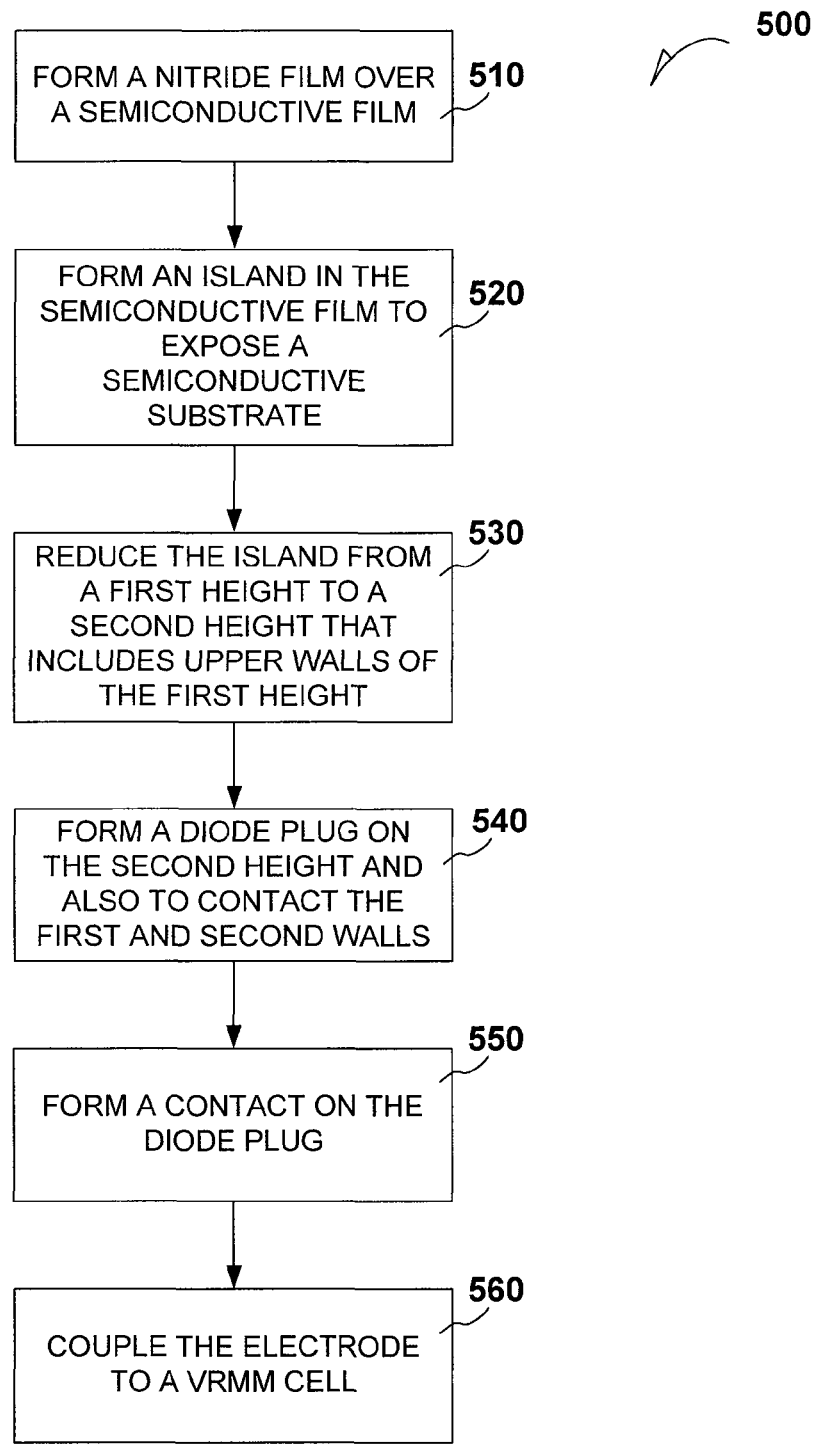
FIG. 5 is a process flow diagram for fabricating a 3-dimensional recess Schottky diode device for a variable-resistance material memory according to an embodiment.

FIG. 5 is a process flow diagram 500 for fabricating a 3-dimensional recess Schottky diode device for a variable-resistance material memory according to an embodiment.

At 510, the process includes forming a nitride film over a semiconductive film.

At 520, the process includes forming an island in the semiconductive film to expose a semiconductive substrate.

At 530, the process includes reducing the island from a first height to a second height that is less than the first height.

At 540, the process includes forming a diode plug on the second height and also to contact the first and second wall that remain at the first height.

At 550, the process includes forming a contact on the diode plug.

At 560, the process includes coupling the contact to a VRMM cell such as a chalcogenide cell.

Figure 6:
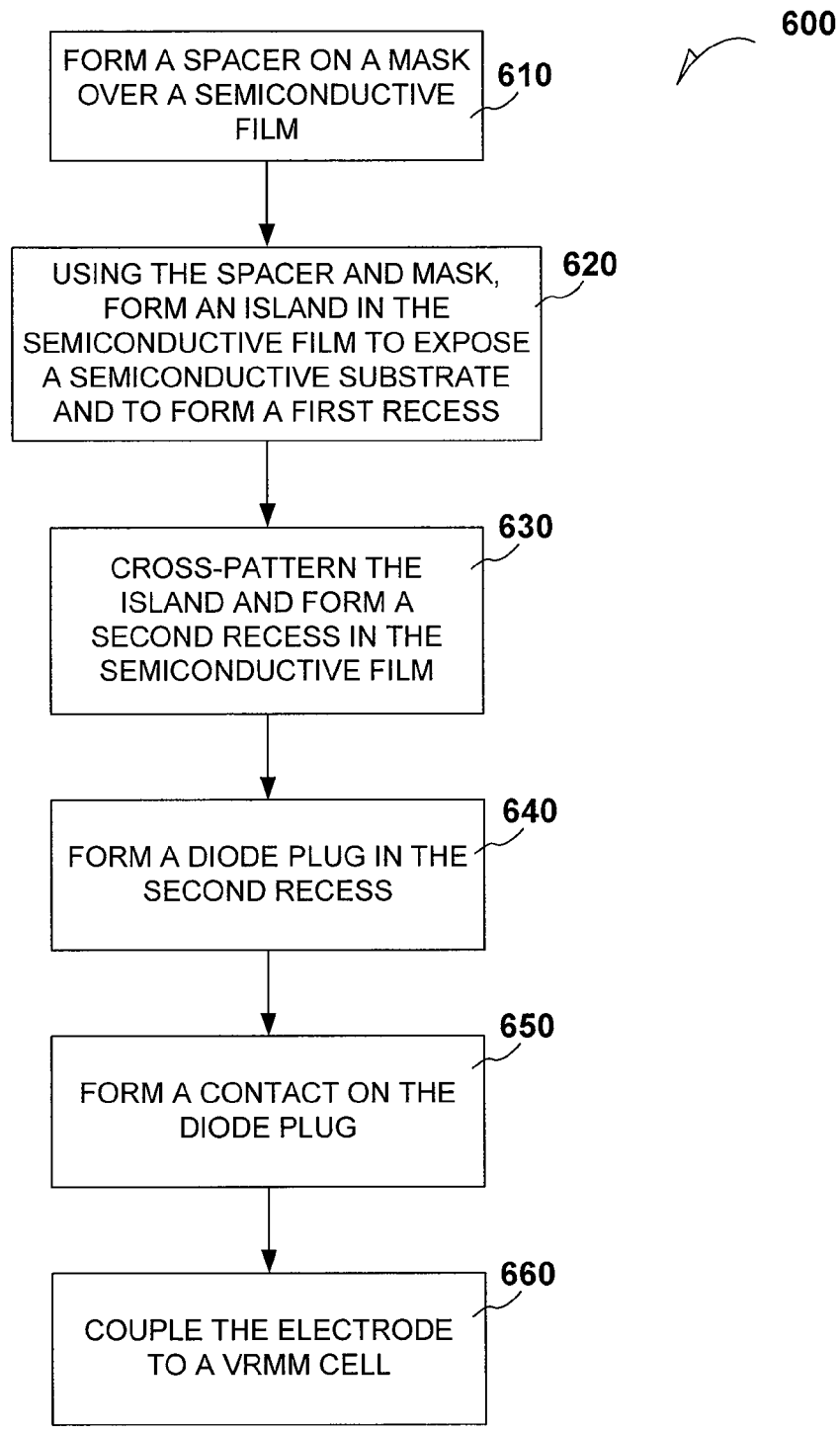
FIG. 6 is a process flow diagram for fabricating a 3-dimensional surrounding-recess Schottky diode device for a variable-resistance material memory according to an embodiment.

FIG. 6 is a process flow diagram 600 for fabricating a 3-dimensional recess Schottky diode device for a variable-resistance material memory according to an embodiment.

At 610, the process includes forming a spacer on a nitride mask that is over a semiconductive film.

At 620, the process includes using the spacer and mask to form an island in the semiconductive film to expose a semiconductive substrate.

At 630, the process includes cross-patterning the island to form a second recess in the semiconductive film. The second recess is characterized by first, second, third, and fourth walls and a floor that are part of the semiconductive film.

At 640, the process includes forming a diode plug on the second height and also to contact the first and second wall and the floor in the semiconductive film.

At 650, the process includes forming a contact on the diode plug.

At 660, the process includes coupling the contact to a VRMM cell such as a chalcogenide cell.

Figure 7:
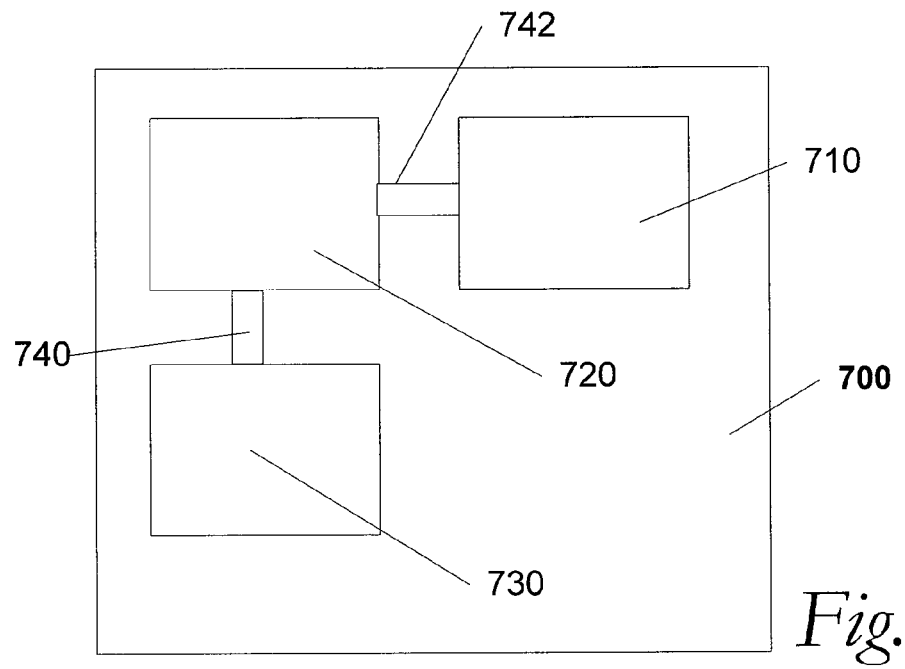
FIG. 7 illustrates an electronic device that includes VRMM embodiments.

FIG. 7 illustrates an electronic device 700 that includes VRMM embodiments as described above. The electronic device 700 includes a first component 720 that benefits from VRMM embodiments. Examples of first component 720 include VRMM arrays. In an embodiment, the first component 720 is a processor that includes VRMM diode devices used for booting up the processor. In these examples, device operation is improved with the presence of VRMM embodiments.

In an embodiment, the device 700 further includes a power source 730. The power source 730 is electrically connected to the first device component 720 using interconnecting circuitry 740. In an embodiment, the interconnecting circuitry 740 includes VRMM embodiments using processing methods described above. In addition to depositing material as described above, techniques such as lithography with masks and/or etching etc. can be used to pattern conducting circuitry.

In an embodiment, the device 700 further includes a second device component 710. The second device component 710 is electrically connected to the first component 720 using interconnecting circuitry 742. Likewise, in one embodiment, the interconnecting circuitry 742 includes VRMM embodiments that are formed using methods described above. Examples of second device components 710 include signal amplifiers, flash memory, logic circuitry, or other microprocessing circuits, etc. Aside from interconnecting circuitry, in an embodiment, the first device component 720 and/or the second device component 710 includes VRMM embodiments using methods described above.

Figure 8:
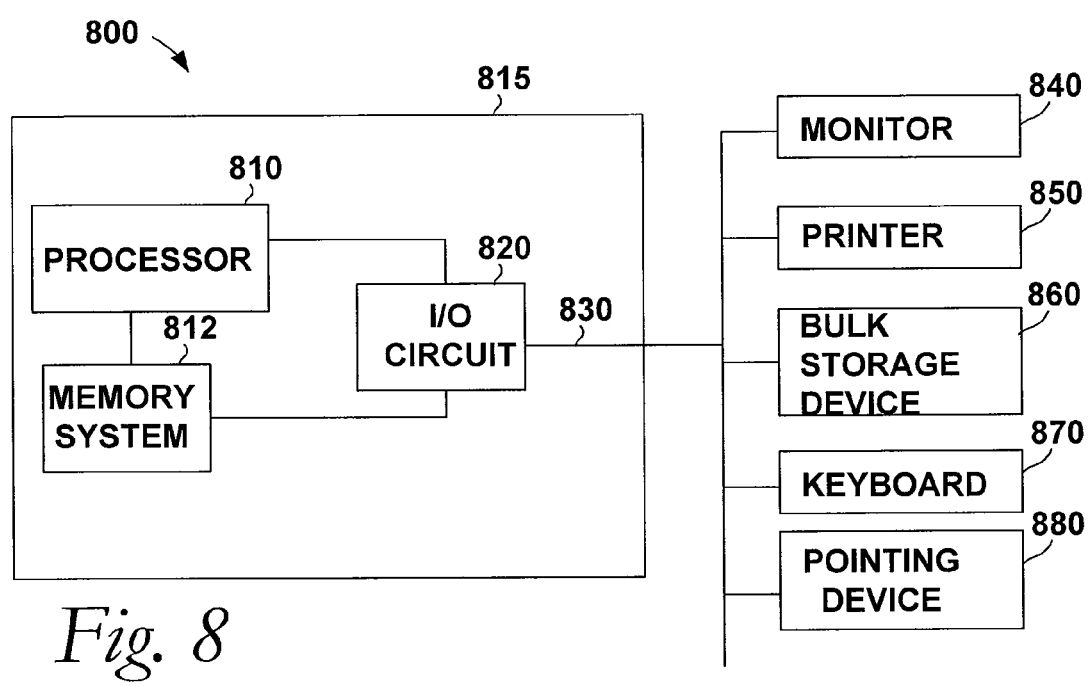
FIG. 8 shows one specific example of a computer system including VRMM embodiments formed.

FIG. 8 shows one specific example of a computer system including VRMM embodiments formed as described above. The computer system 800 contains a processor 810 and a memory system 812 housed in a computer unit 815. The computer system 800 is but one example of an electronic system containing another electronic system. In an embodiment, the computer system 800 contains an I/O circuitry 820 coupled to the processor 810 and the memory system 812. In an embodiment, the computer system 800 contains user interface components coupled to the I/O circuitry 820. In an embodiment, a VRMM embodiment is coupled to one of a plurality of I/O pads or pins 830 of the I/O circuitry 820. The I/O circuitry 820 can then be coupled to at least one of a monitor 840, a printer 850, a bulk storage device 860, a keyboard 870, and a pointing device 880. It will be appreciated that other components are often associated with the computer system 800 such as modems, device driver cards, additional storage devices, etc. It will further be appreciated that the processor 810, the memory system 812, the I/O circuitry 820, and partially isolated structures or data storage devices of computer system 800 can be incorporated on a single integrated circuit. Such single package processing units may reduce the communication time between the processor 810 and the memory system 800.

Figure 9:
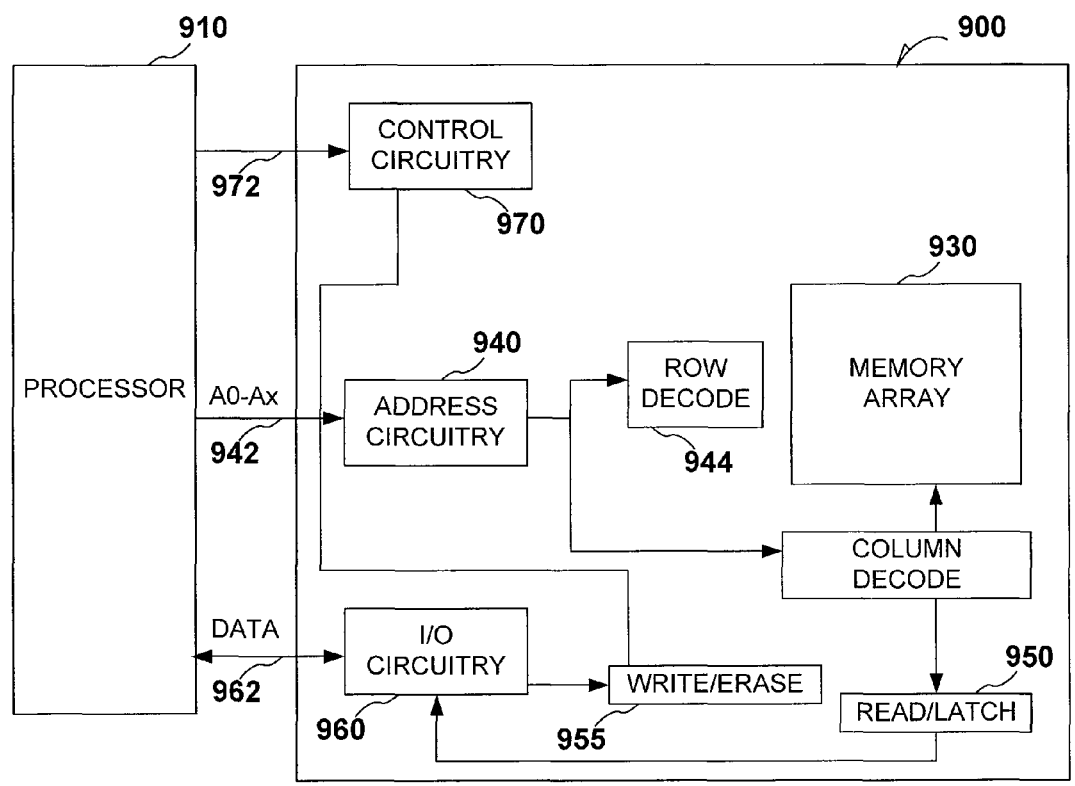
FIG. 9 illustrates a functional block diagram of a memory device that can incorporate the variable-resistance material memory array embodiments.

FIG. 9 illustrates a functional block diagram of a memory device 900 that can incorporate the variable-resistance material memory array embodiments. The memory device 900 is coupled to a processor 910. The processor 910 may be a microprocessor or some other type of controlling circuitry. The memory device 900 and the processor 910 form part of an electronic system 920. The memory device 900 has been simplified to focus on features of the memory that are helpful in understanding the several embodiments.

The memory device 900 includes a VRMM array 930 that can be comprised of the several VRMM cells as described previously. The VRMM array 930 is arranged in banks of rows and columns. The control gates of each row of VRMM cells is coupled with a word line while the drain and source connections of the VRMM cells are coupled to bit lines.

An address buffer circuit 940 is provided to latch address signals provided on address input connections A0-Ax 942. Address signals are received and decoded by a row decoder 944 and a column decoder 946 to access the VRMM array 930. It will be appreciated by those skilled in the art, with the benefit of the present description, that the number of address input connections A0-Ax 942 depends on the density and architecture of the VRMM array 930. That is, the number of addresses increases with both increased VRMM cell counts and increased bank and block counts.

The memory device 900 reads data in the VRMM array 930 by sensing voltage or current changes in the VRMM array 930 columns using sense/buffer circuitry 950. The sense/buffer circuitry 950, in one embodiment, is coupled to read and latch a row of data from the VRMM array 930. Data input and output buffer circuitry 960 is included for bi-directional data communication over a plurality of data connections 962 with the processor 910. Write circuitry 955 is provided to write data to the VRMM array 930.

Control circuitry 970 decodes signals provided on control connections 972 from the processor 910. These signals are used to control the operations on the VRMM array 930, including data read, data write (program), and erase operations. The control circuitry 970 may be a state machine, a sequencer, or some other type of controller.

The VRMM array 930 illustrated in FIG. 9 has been simplified to facilitate a basic understanding of the features of the memory device 900.

This Detailed Description refers to the accompanying drawings that show, by way of illustration, specific embodiments in which the present disclosure may be practiced. These embodiments are described in sufficient detail to enable those skilled in the art to practice the disclosed embodiments. Other embodiments may be used, and structural, logical, and electrical changes may be made without departing from the scope of the present disclosure. The various embodiments are not necessarily mutually exclusive, as some embodiments can be combined with one or more other embodiments to form new embodiments.

The Detailed Description is, therefore, not to be taken in a limiting sense, and the scope of this disclosure is defined only by the appended claims, along with the full scope of equivalents to which such claims are entitled.

The terms "wafer" and "substrate" used in the description include any structure having an exposed surface with which to form an electronic device or device component such as a component of an integrated circuit (IC). The term substrate is understood to include semiconductor wafers. The term substrate is also used to refer to semiconductor structures during processing and may include other layers such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art.

The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The Abstract is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. An apparatus comprising:
an epitaxial prominence disposed upon a film, the epitaxial prominence having a top and vertical sides;
a conductive container disposed to envelop the epitaxial prominence such that the conductive container contacts the top and the vertical sides of the epitaxial prominence;
an electrode disposed above and on the container conductor; and
a variable-resistance material memory (VRMM) cell coupled to the electrode with the variable-resistance material memory (VRMM) cell above and contacting the electrode such that the electrode is between the variable-resistance material memory (VRMM) cell and the conductive container.

2. The apparatus of claim 1, wherein the conductive container is a metal derived from a lid and a spacer cylinder.

3. The apparatus of claim 1, wherein the conductive container is a semiconductive material derived from a lid and a spacer cylinder.

4. The apparatus of claim 1, wherein the film is an n-doped semiconductive material that is disposed on a p-doped semiconductive substrate, and wherein the epitaxial prominence is an n-doped semiconductive material.

5. The apparatus of claim 1, wherein the conductive container is a metal derived from a lid and a spacer cylinder, wherein the film is an n-doped semiconductive material that is disposed on a p-doped semiconductive substrate, and wherein the epitaxial prominence is an n-doped semiconductive material.

6. The apparatus of claim 1, wherein the VRMM cell is part of a computer system.

7. The apparatus of claim 1, wherein the VRMM cell includes a phase-change chalogenide cell.

8. The apparatus of claim 1, wherein the apparatus includes a top electrode on the VRMM cell coupling the VRMM cell to a bit line.

9. The apparatus of claim 8, wherein the top electrode includes titanium nitride.

10. The apparatus of claim 1, wherein the epitaxial prominence, the conductive container, and the electrode are disposed in a dielectric.

11. The apparatus of claim 1, wherein the apparatus includes a word line strap coupled to the VRMM cell through a word line contact.

12. A process comprising:
forming an epitaxial prominence upon a film, the epitaxial prominence having a top and vertical sides;
forming a container conductor conformally over the epitaxial prominence, the container conductor disposed to envelop the epitaxial prominence such that the conductive container contacts the top and the vertical sides of the epitaxial prominence;
forming an electrode disposed above and on the container conductor, the conductive container contacting the top and the vertical sides of the epitaxial prominence; and
coupling the electrode to a variable-resistance material memory (VRMM) cell with the variable-resistance material memory (VRMM) cell above and contacting the electrode such that the electrode is between the variable-resistance material memory (VRMM) cell and the container conductor.

13. The process of claim 12, wherein the container conductor is a metal and wherein forming the container conductor includes:
forming a nitride film over the film;
forming a dielectric first film over the nitride film;
patterning and etching a recess through the dielectric first film and the nitride film to stop on the film;
forming the epitaxial prominence;
forming a conductive first film above and on the epitaxial prominence; and
forming a conductive spacer second film on the epitaxial prominence, wherein the conductive first film and the conductive spacer second film form the container conductor.

14. The process of claim 12, wherein coupling the electrode to the VRMM cell further includes:
forming a top electrode to contact the VRMM cell; and
coupling the top electrode to a bit line.

15. The process of claim 12, wherein forming the container conductor includes:
forming a nitride film over the film;
forming a dielectric first film over the nitride film;

patterning and etching a recess through the dielectric first film and the nitride film to stop on the film;

forming the epitaxial prominence;

conformally forming the container conductor by a process of chemical vapor deposition upon the epitaxial prominence.

16. The process of claim 12, wherein forming the container conductor includes:

forming a nitride film over the film;

forming a dielectric first film over the nitride film;

patterning and etching a recess through the dielectric first film and the nitride film to stop on the film;

forming the epitaxial prominence, wherein the epitaxial prominence is an n-doped semiconductive material;

forming a metal first film above and on the epitaxial prominence; and forming a metal spacer second film on the epitaxial prominence, wherein the metal first film and the metal spacer second film form the container conductor.

* * * * *

UNITED STATES PATENT AND TRADEMARK OFFICE
CERTIFICATE OF CORRECTION

| | | |
|---|---|---|
| PATENT NO. | : 8,212,281 B2 | Page 1 of 1 |
| APPLICATION NO. | : 12/014939 | |
| DATED | : July 3, 2012 | |
| INVENTOR(S) | : Jun Liu et al. | |

It is certified that error appears in the above-identified patent and that said Letters Patent is hereby corrected as shown below:

On the cover page, item (56), under "Other Publications", in column 2, line 13, delete "Meetings," and insert -- Meeting, --, therefor.

In column 14, line 17, in Claim 7, delete "chalogenide cell." and insert -- chalcogenide cell. --, therefor.

Signed and Sealed this
Twenty-eighth Day of August, 2012

David J. Kappos
*Director of the United States Patent and Trademark Office*